United States Patent [19]
Davis et al.

[11] Patent Number: 6,069,905
[45] Date of Patent: May 30, 2000

[54] VERTICAL CAVITY SURFACE EMITTING LASER HAVING INTENSITY CONTROL

[75] Inventors: Richard A Davis, Plano; Walter T. Matzen, Richardson; James K. Guenter, Garland, all of Tex.; David Smith, Ellicott City, Md.

[73] Assignee: Honeywell Inc., Morristown, N.J.

[21] Appl. No.: 09/001,894

[22] Filed: Dec. 31, 1997

[51] Int. Cl.[7] ...................................................... H01S 3/18
[52] U.S. Cl. ................... 372/43; 372/44; 372/46; 372/50; 372/99; 372/103; 372/96; 372/49
[58] Field of Search ................... 372/43, 44, 45, 372/46, 49, 50, 99, 103, 96

[56] References Cited

U.S. PATENT DOCUMENTS

| | | | |
|---|---|---|---|
| 5,606,572 | 2/1997 | Swirhun et al. | |
| 5,737,348 | 4/1998 | Smith | 372/31 |
| 5,761,229 | 6/1998 | Baldwin et al. | 372/31 |
| 5,812,582 | 9/1998 | Gilliland et al. | |
| 5,835,514 | 11/1998 | Yuen et al. | 372/36 |

FOREIGN PATENT DOCUMENTS

| | | |
|---|---|---|
| 0786839A1 | 7/1997 | European Pat. Off. |
| 0805528A2 | 11/1997 | European Pat. Off. |
| 2300031 | 2/1997 | United Kingdom |

*Primary Examiner*—Brian Healy
*Attorney, Agent, or Firm*—Roland W. Norris; Kris T. Fredrick; John Shudy

[57] ABSTRACT

A vertical cavity surface emitting laser having intensity control for maintaining a constant proportional output under varying conditions of the laser. A tilted window is situated over the laser output to reflect a portion of the light to a photo detector area. Signals representing light on the photo detector go to a feedback circuit which controls the power output of the laser. The tilted window has a metallic coating for partial reflection and for minimizing polarization effects on reflected and transmitted light. The photo detector has an anti-reflective coating for likewise minimizing polarization effects of the detected light. The VCSEL and photo detector are situated on the same substrate.

16 Claims, 8 Drawing Sheets

VERTICAL CAVITY SURFACE EMITTING LASER HAVING INTENSITY CONTROL

BACKGROUND

The invention pertains to vertical cavity surface emitting lasers (VCSEL's), and particularly to VCSEL's having a constant output. More particularly, the invention pertains to VCSEL's having power output monitors and feedback power control mechanisms.

Electrical parameters of lasers may vary due to effects such as manufacturing tolerance, temperature and aging. Control of power output and bias conditions enhances performance of semiconductor lasers. Control of output power also allows relaxation of parameters, thus increasing the yield of useful devices. In fiber optic applications, the desired power output is the highest value consistent with eye safety and long term reliability. It is common practice to monitor the output power of the laser and feedback a portion of the signal to circuitry which controls the operating conditions of the device. A critical requirement is that the ratio of the feedback signal to the coupled power output be constant. The problem in maintaining a relationship between the feedback and output is linearity for maintaining constant proportional output under varying conditions of the VCSEL.

SUMMARY OF THE INVENTION

A photo detector or diode, reflective window and feedback device are used to detect, monitor and control the vertical cavity surface emitting laser (VCSEL) output to overcome above-noted problems. The photo detector or diode should be compatible with integral packaging and be inexpensive. Compact packaging with electrical and capacitive isolation between the VCSEL and the photo detector is necessary as is proper attention to optical effects, such as polarization, that can interfere with the proportionality between the feedback and the output.

The present invention includes a diode structure which is a silicon photo detector used for monitoring the power output of the VCSEL. The photo detector is a monolithic structure having an active junction area for collection of an optical signal and an isolated pad area for mounting the VCSEL. Unlike edge emitting lasers, the VCSEL is ideally suited for mounting directly on top of the photo detector. The photo detector, with the VCSEL attached, is mounted on a header and covered by a can with a tilted window. The window is about 0.01 inches thick and may be made from glass or other appropriate material such as sapphire. The window is coated for reflecting some of the light emitted from the VCSEL back to the detector and for inhibiting external light from entering the can. In a preferred embodiment, the coating is made of material composed of a noble metal with low complex refractive index dispersion at the operating wavelength, for example, platinum or palladium at 850 nanometers. For the example metals, the coating is of the order of 100 angstroms thick. The electrical power to the VCSEL is controlled in accordance with a feedback circuit via the detected light reflected back to the photo detector or diode. Maintaining power out of the VCSEL requires a linear relationship between the feedback and the VCSEL output. This relationship is accomplished with particular geometries of detected VCSEL light on the detector via a location of the detector and window reflector relative to the VCSEL.

The tilted window can for a VCSEL is intended for use with the off-center photo detector or diode sub-mount. The angle of the window is set such that the coherent light from the VCSEL top surface strikes the active area of the off-center photo detector or diode sub-mount without shadowing by the VCSEL chip itself. When shadowing by the VCSEL chip is eliminated, the tracking ratio is rendered independent of changes in the output pattern of the VCSEL due to changes in drive current and temperature. This device also allows the effective use of a larger fraction of the VCSEL's on a wafer by utilizing the constant tracking ratio to apply feedback to the combination of the VCSEL and its drive circuit. Tracking ratio is defined as the ratio of the power coupled to the fiber optic waveguide to the response of the back monitor photo detector or diode. It is necessary that the height and angle of the tilt window can be compatible with the height of the VCSEL chip as well as the size and location of the optically sensitive area of the offset photo detector or diode. The dimensions and angle of the tilt window disclosed here are one specific design and do not represent limitations of this general device. There is an approach for partially overcoming the shadowing of the VCSEL chip by using reflections from both surfaces of a flat window having a centered photo detector or diode. However, the tilt window can provides a more constant tracking ratio than the flat window can. There is an alternate, but more expensive, approach for illuminating the off-center photo detector or diode by using a grating lens on a flat window VCSEL can.

DESCRIPTION OF THE EMBODIMENT

Figure 1A:
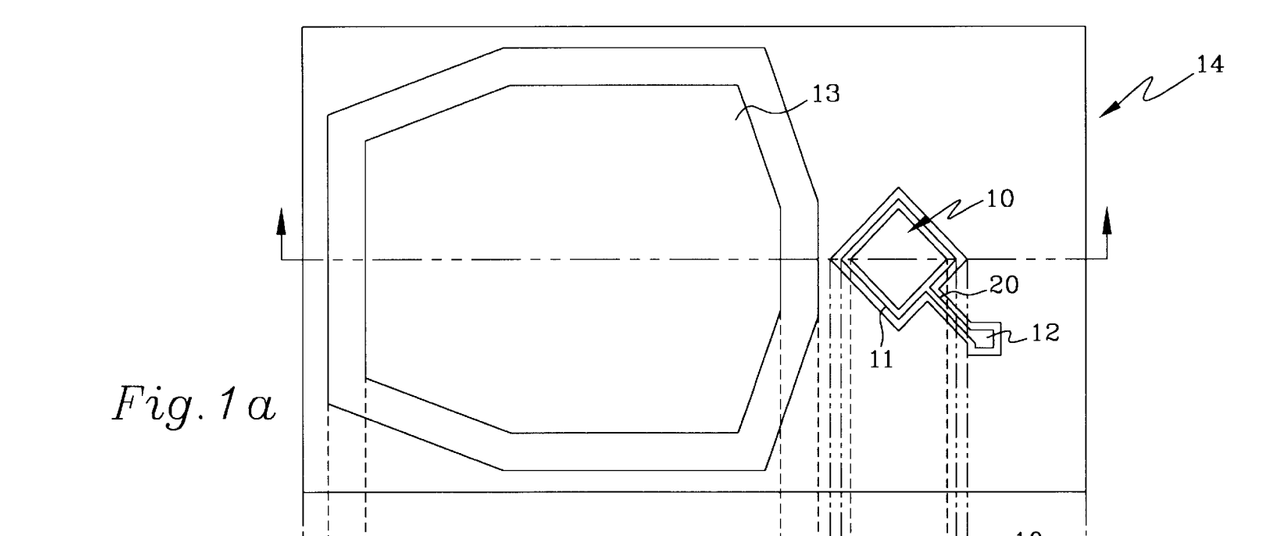
FIGS. 1a and 1b reveals a layout of a VCSEL and the photo detector for monitoring power.
Figure 1B:
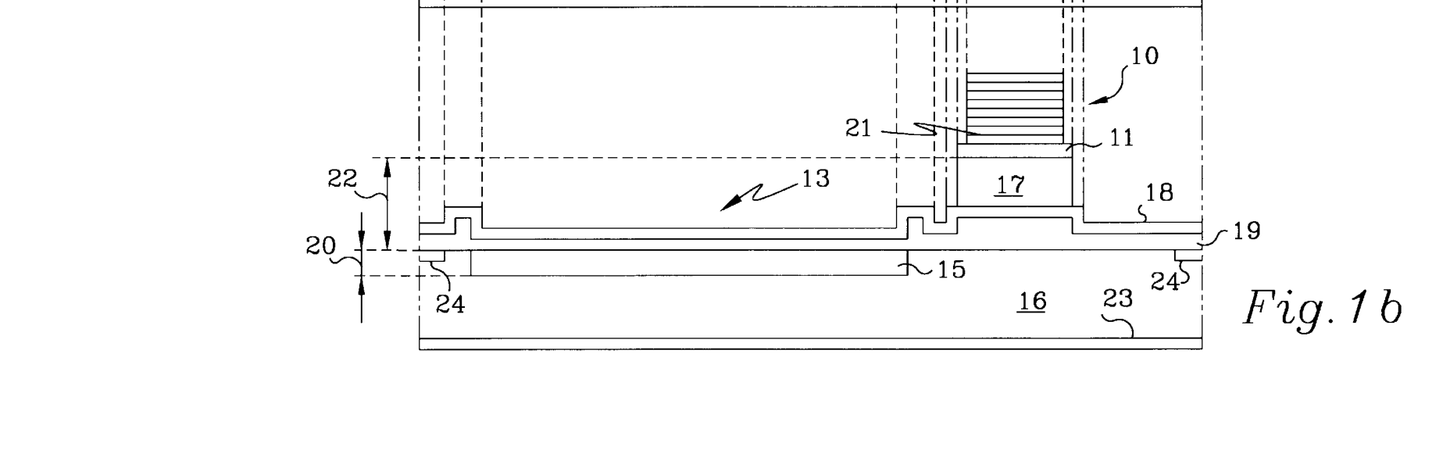

One layout of a mounting pad 11 and terminal pad 12 for a VCSEL 10, situated in a photo detector area 13 of integrated circuit 14 is illustrated by FIG. 1a. The proportionality of photo detector area 13 relative to pad area 11 is not to scale. In FIG. 1b, which is a cross section A—A of FIG. 1a, the active junction area 13 for collecting the reflected optical signal is formed by a planar P-type diffusion 15 into an N-type silicon substrate 16. Diffused region 15 is the anode of photo detector 13 and substrate 16 is the cathode. VCSEL 10 is mounted on an isolated pad area 11 which is isolated from N-type substrate 16 by a deposited oxide 17, an oxide/nitride anti-reflection coating 18 and a grown oxide 19. Pads 11 and 12 and connecting strip 20 may be fabricated from gold.

Diffusion depth 20 of P-type region 15 is appropriate for high collection efficiency of photo detector 13. P-type region 15 is covered with thin grown oxide 19 and anti-reflection coating 18 which is optimized for collection of photons at the wavelength and incidence angle of the reflected optical signal, and also designed to minimize the difference between collection of P- and S-polarized radiation. N-type silicon substrate 16 may be homogeneous, epitaxial or wafer bond material. Pad 11, on which a VCSEL 10 cathode 21 is mounted, is isolated from substrate with a dielectric coating 17. Thickness 22 of dielectric coatings 17 and 19 is maximized to decrease capacitance between VCSEL 10 and substrate 16. At the same time, the lateral extent of the thick dielectric must be minimized, because the optical transmission of such a thick coating will exhibit significant polarization selectivity. The dielectric is formed by a combination of thermally grown oxide 19 and deposited oxide 17. The backside of the N-type substrate 16 is covered with a dielectric layer 23 for isolation from the header of the containing can package. On the top edge or border of substrate 16 is an N+ type diffusion 24.

Figure 2:
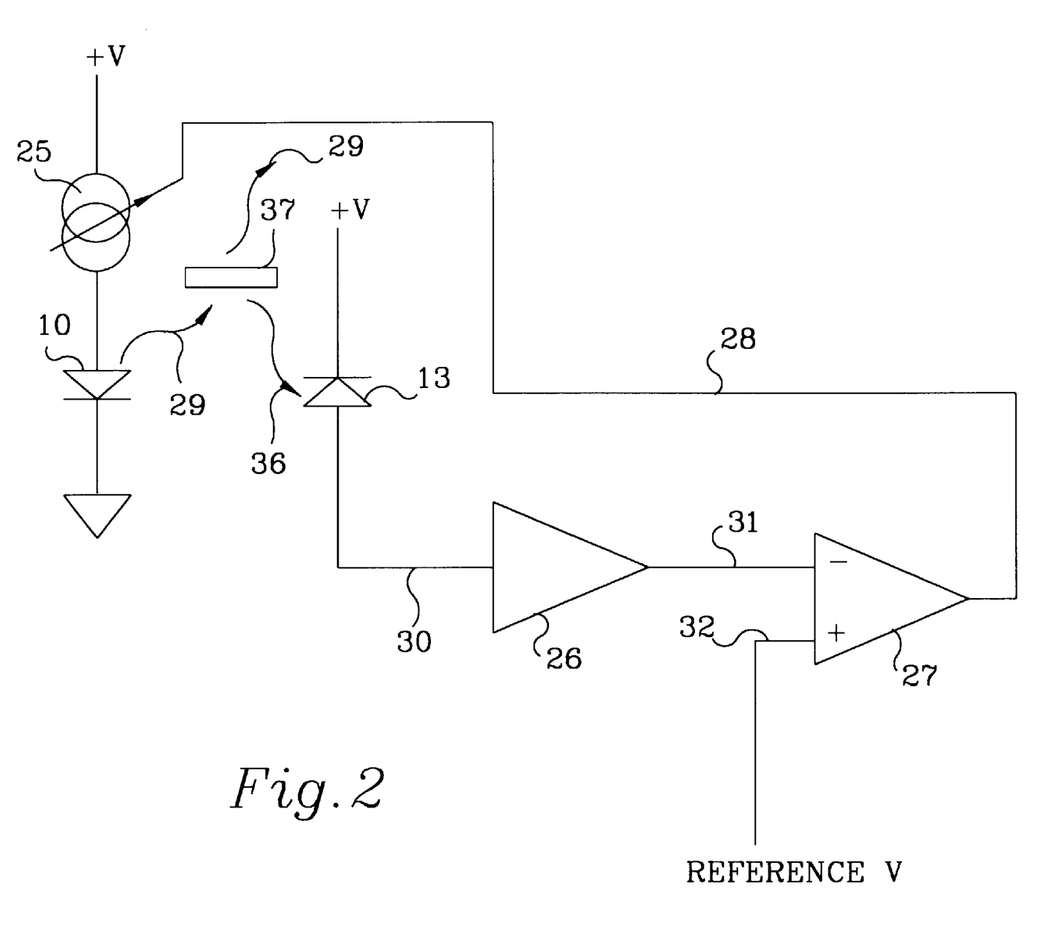
FIG. 2 is a schematic of the feedback electronics for the invention.

A limitation of the device is non-linearity of tracking between a feedback signal 28 and a VCSEL 10 output 29. (See FIG. 2.) Diode 13 senses the received laser 10 output 29 to convert it into transmitted signal 30. Signal 30 is amplified or buffered by amplifier 26 into signal 31 which goes into the inverting input of differential amplifier 27. A reference voltage signal 32 goes to the noninverting input of amplifier 27. The output of amplifier 27 is a feedback signal 28 that goes to variable current source 25 that adjusts the amount of current to VCSEL 10 to control power output 29 of VCSEL 10 in accordance with feedback signal 28. The geometric pattern of the laser output varies with power output 29, such that the ratio of the feedback signal 28 to the transmitted signal 30 is not constant as a function of power or intensity of output light 29.

Figure 3:
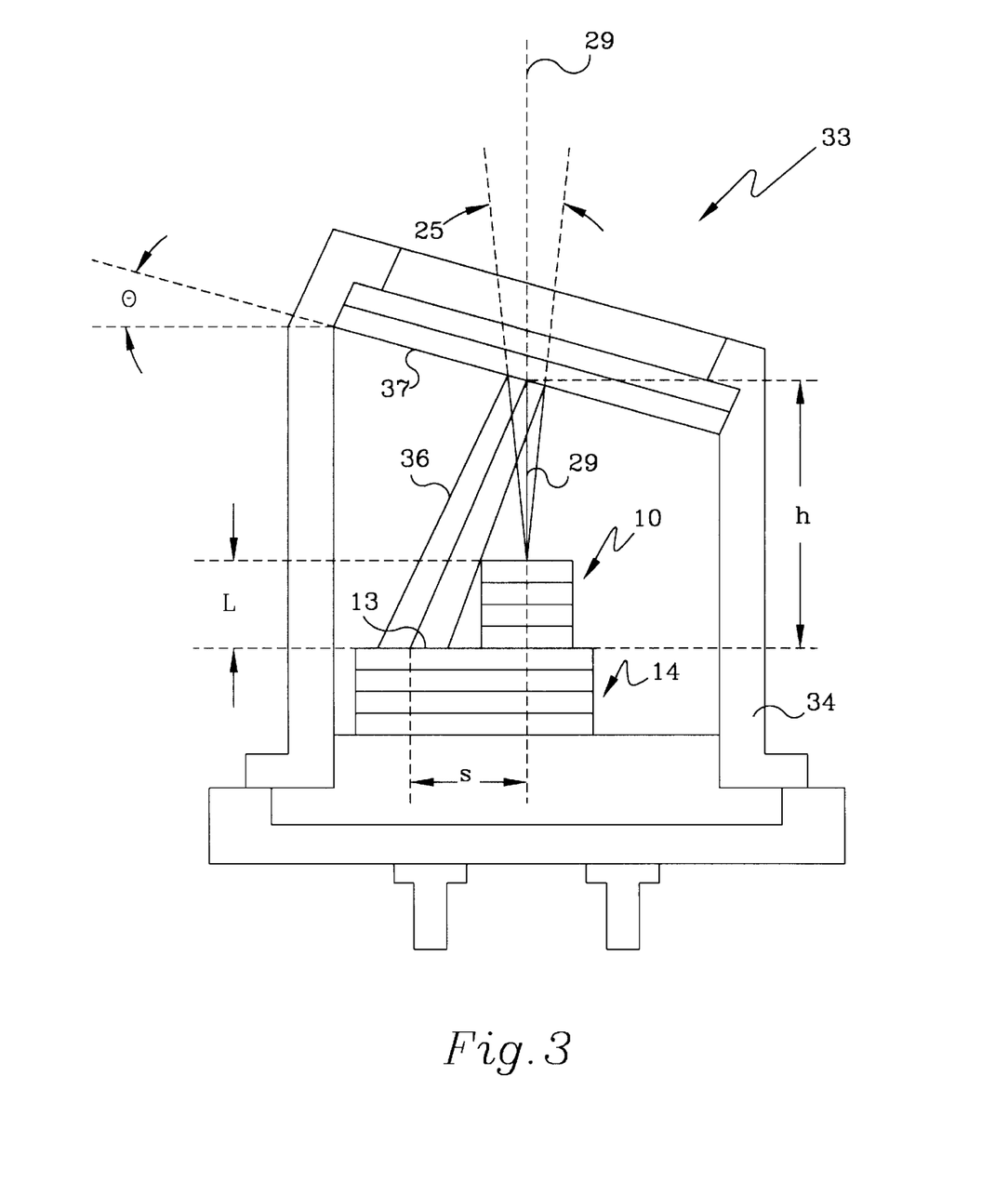
FIG. 3 shows the structure of the VCSEL, detector and the encompassing can package.

A device 33 is designed to provide linear tracking. The solution is to use a can package 34 having a window 37 which is tilted at an angle θ with respect to silicon die 14 to direct a reflected light pattern 36 from partially reflective surface 37, as shown in FIG. 3. The active junction area 10 is positioned with respect to the VCSEL pad 14 which is geometrically designed so as to assure collection of light from an entire reflected pattern 36, including tolerances. In addition, coating 18 over the active region 13 must be designed so as to minimize polarization sensitivity. Again, thick dielectric 17 under pad 11 reduces VCSEL-to-substrate capacitance.

For some applications of the VCSEL, faster response time of the feedback circuit is preferred. The response time of a photo detector fabricated with a homogeneous substrate is limited by transit time and/or the RC (resistor-capacitor) time constant. The response time may be substantially improved by the use of an epitaxial or wafer bond substrate.

The maximum dimension d (i.e., the diameter of the major axis) of the spot size on monitor 13 is given by the following equation, $$d = 2\tan(\zeta)\left(h + (h+L)\tan\left(\frac{1}{2}\tan^{-1}\left(\frac{s}{h}\right)\right)\right)\left[\frac{2 - \left(\frac{s}{h}\right)^2 \tan^2(\zeta) + \tan^2\left(\frac{1}{2}\tan^{-1}\left(\frac{s}{h}\right)\right)}{1 - \left(\frac{s}{h}\right)^2 \tan^2(\zeta)}\right],$$

where s is the distance between VCSEL 10 and monitor 13 center lines, h is the height of reflective surface 37 above monitor or photo detector 13, L is the height of monitor 13 above VCSEL 10, and ζ is half of the angle of the VCSEL 10 emission cone. The spot must be within the detector 13 to avoid overfill, and shadowing should not be possible.

Angle θ between tilted window 37 and silicon die 14 is given by the following equation, $$\theta_{tilt} = \frac{1}{2}\tan^{-1}\left(\frac{s}{h}\right).$$

Figure 4:
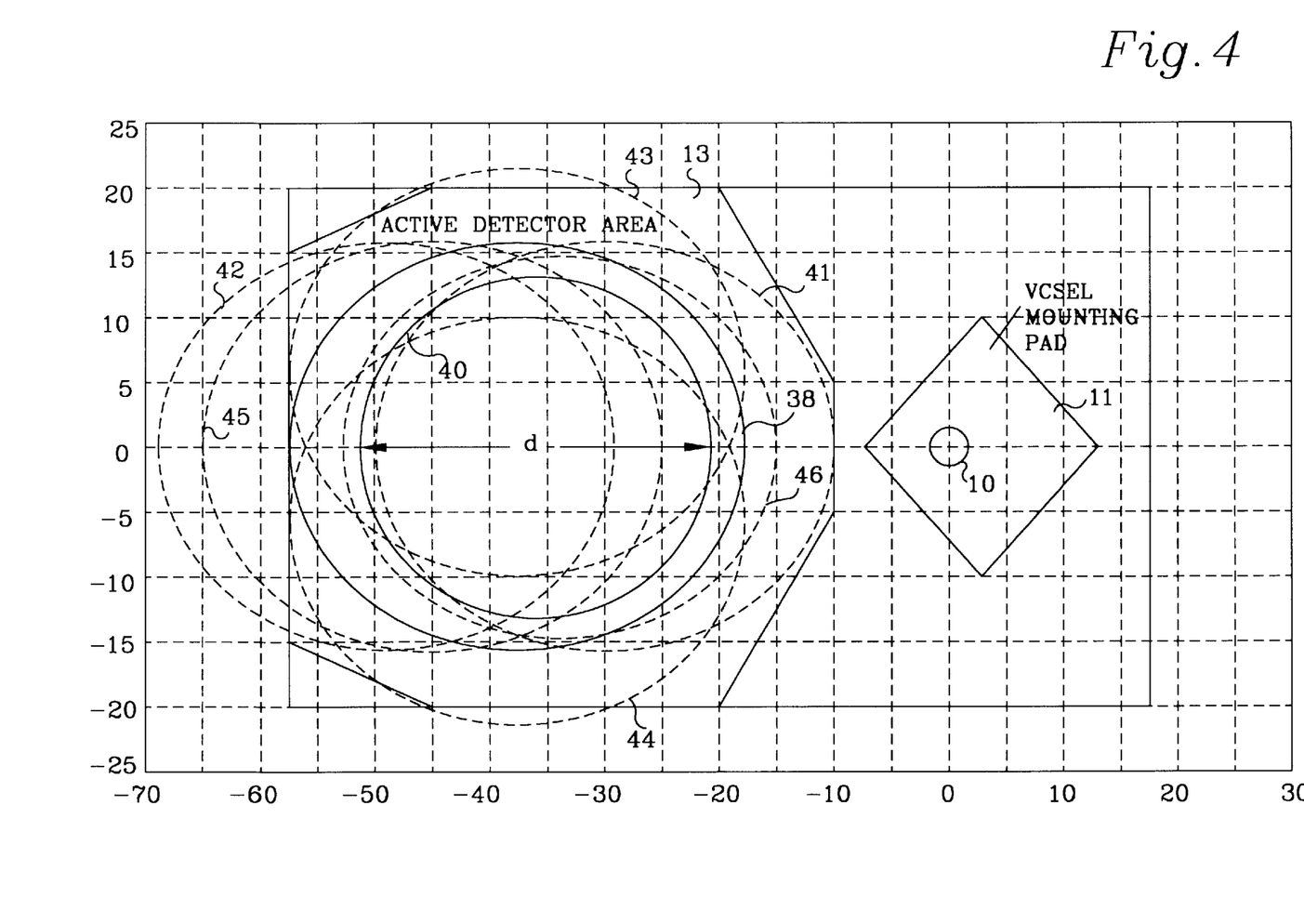
FIG. 4 the patterns of reflected VCSEL light on the detector area.
Figure 5:
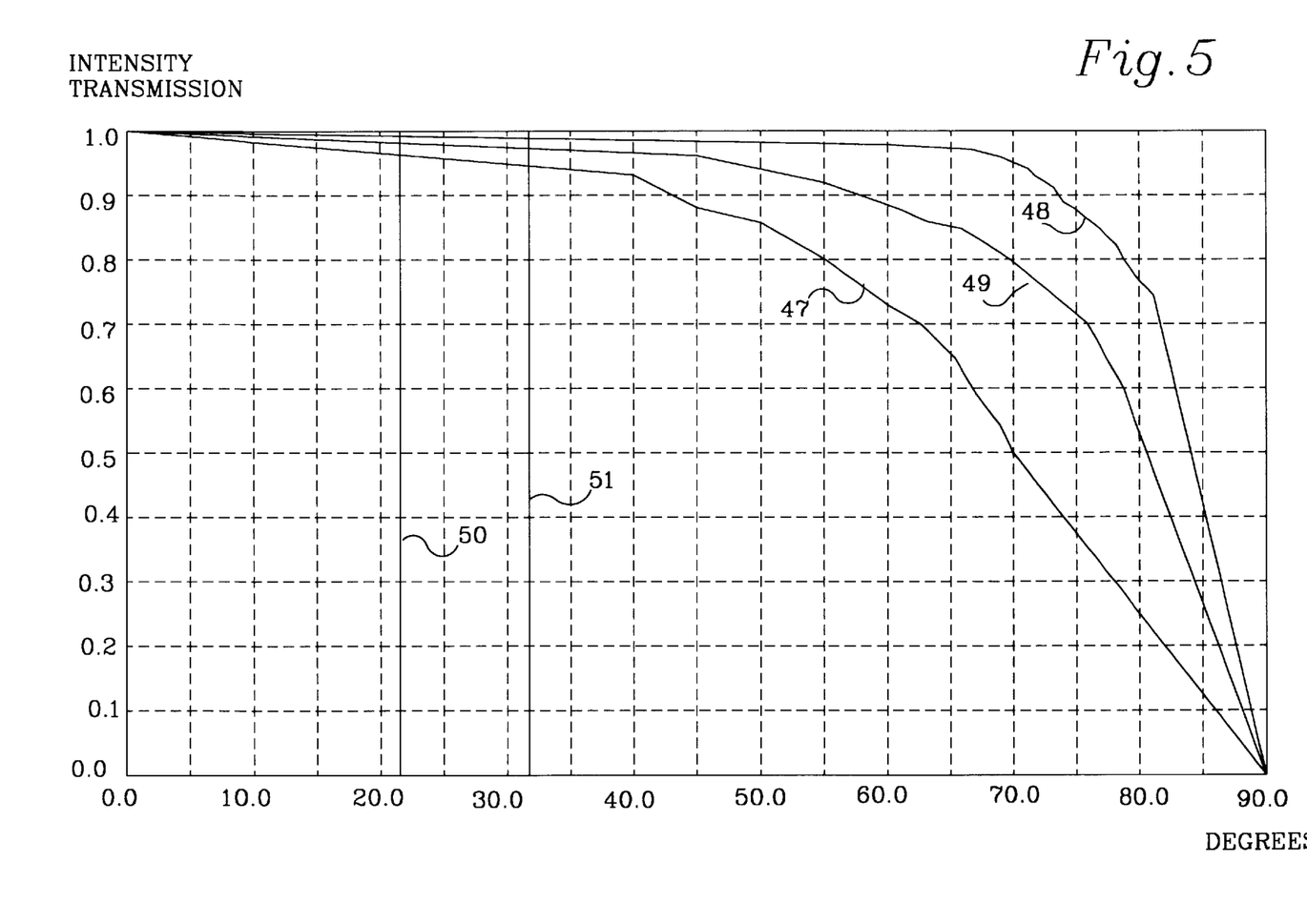
FIG. 5 is an example of polarization sensitivity versus reflection angle that for transmitted light that can occur in a reflective configuration designed for power monitoring.

FIG. 5 shows the relative locations of active detector area 13 and VCSEL 10 mounting pad 11. This layout may be different for different configurations. Any pattern from the reflection of a cone from a tilted window will be elliptical. The variant ellipses of FIG. 4 can be attained through intentional adjustment of window tilt and position, as described below, but the main reason to model the variants is to establish the active area shape affording the best packaging tolerance.

VCSEL 10 emits light 29 in a form of an emission cone having an angle of 2ζ. A portion 36 of light 29 is reflected onto detector area 13 as in a nominal pattern 38 with reflective window 37 having a nominal tilt angle θ. The pattern of portion 36 of VCSEL light 29 may be adjusted with tilt angle θ, distance s, height h, length L, and rotation r of window 37 and can 34 relative to detector 13 and VCSEL 10. Optional patterns 41, 42, 43 and 44 may be utilized.

FIG. 4 shows ellipses 38 and 40 as an approach leading to appropriate active area shapes, of reflected light 36 on active detector area 13. Ellipse pattern 38 may be adjusted to be like ellipse patterns 41–44. Ellipse pattern 38 has 0.15 NA rays which correspond to a 17 degree VCSEL emission cone. (NA is the trigonometric sine of the half-angle of the emission cone; e.g., 2arcsin 0.15 is approximately 17 degrees.) Comparatively, ellipse pattern 40 has 0.12 NA rays which correspond to a 14 degree VCSEL emission cone. Corresponding patterns like patterns 41–44 are not shown for ellipse pattern 40.

Various patterns evolving from nominal ellipse 38 are effected through adjustments of tilt, distance and rotation. The following examples are the result of a variation of just one parameter of the settings for nominal pattern 38. Ellipse 41 is the result of reducing d by 8 mils and ellipse 45 is the result of increasing d by 8 mils. Ellipse 46 is the result of a 14 degree angle θ of tilt window 37 relative to die 14, and ellipse 42 is the result of a 20 degree angle θ tilt. Ellipse 43 is the result of a positive ten degree rotation of tilted window 37 relative to VCSEL 10 and detector 13, and ellipse 44 is the result of a negative ten degree rotation.

A graph of FIG. 5 shows the polarization sensitivity at the photo detector or diode 13 surface. This polarization is an issue which is minimized by the present invention. The incident angle of the reflective beam is twice the mirror 37 tilt angle θ. The graph shows intensity transmission of light through window 37 versus the incident angle of light 29 in degrees. An anti-reflective coating is on the surface of the window 37. The incident media is air, the light wavelength is 850 nanometers (nm), and the substrate is silicon. Curve 47 shows the transmission of S-polarized light; curve 48 shows the transmission of P-polarized light; and curve 49 shows the average transmission of both S- and P-polarized light. Using computer generation at a 22 degree angle of incidence, at line 50 of the graph, the transmission of S-polarized light is 0.9911, and of P-polarized light is 0.9964. The average is 0.99375. For a 32 degree angle of incidence at line 51 of the graph, the transmission of S-polarized light is 0.9734, and of P-polarized light is 0.9901. The average is 0.98175. The percentage differences at lines 50 and 51, respectively, are ±0.30 and ±0.85 percent.

Figure 6A:
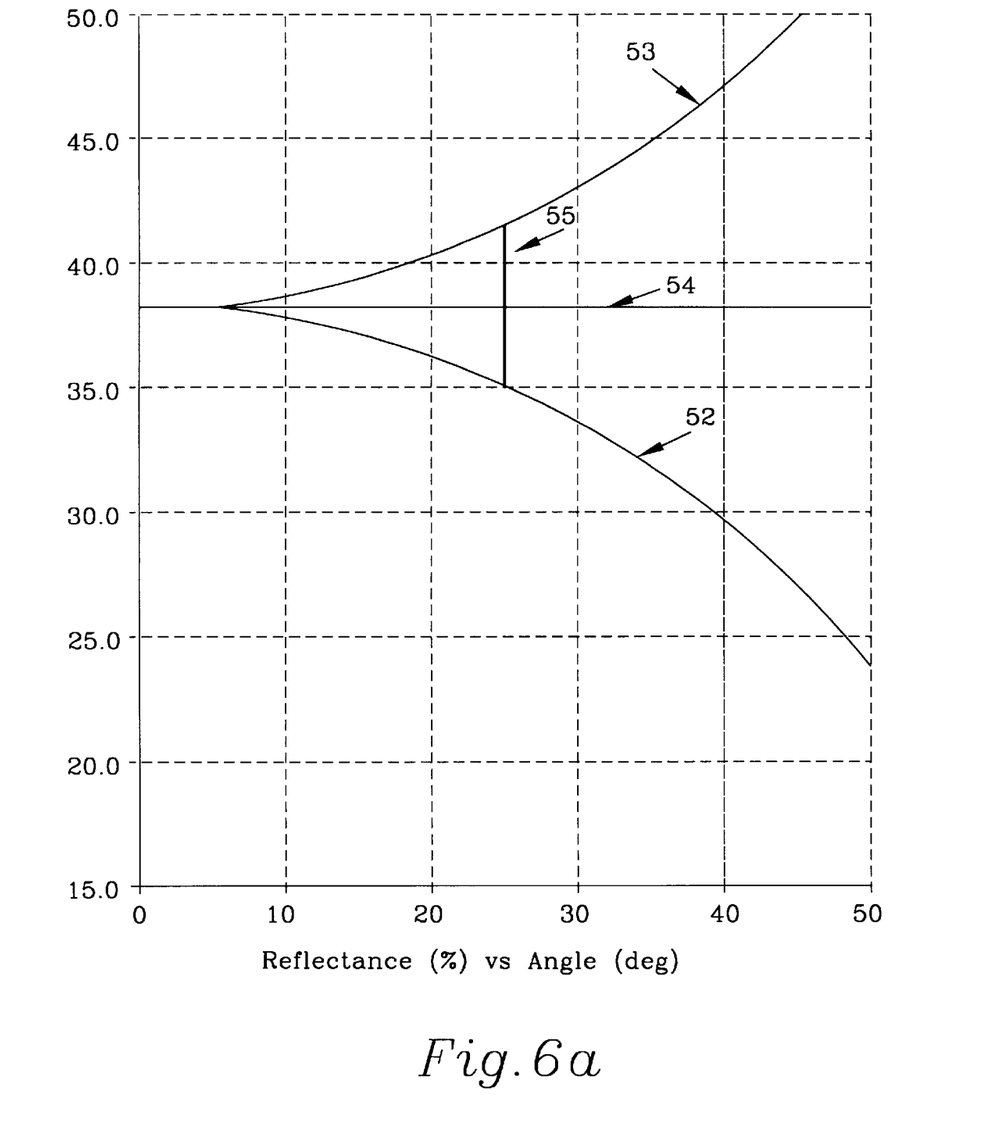
FIGS. 6a and 6b reveal the polarization effects of a metallic reflective surface on a tilted window.
Figure 6B:
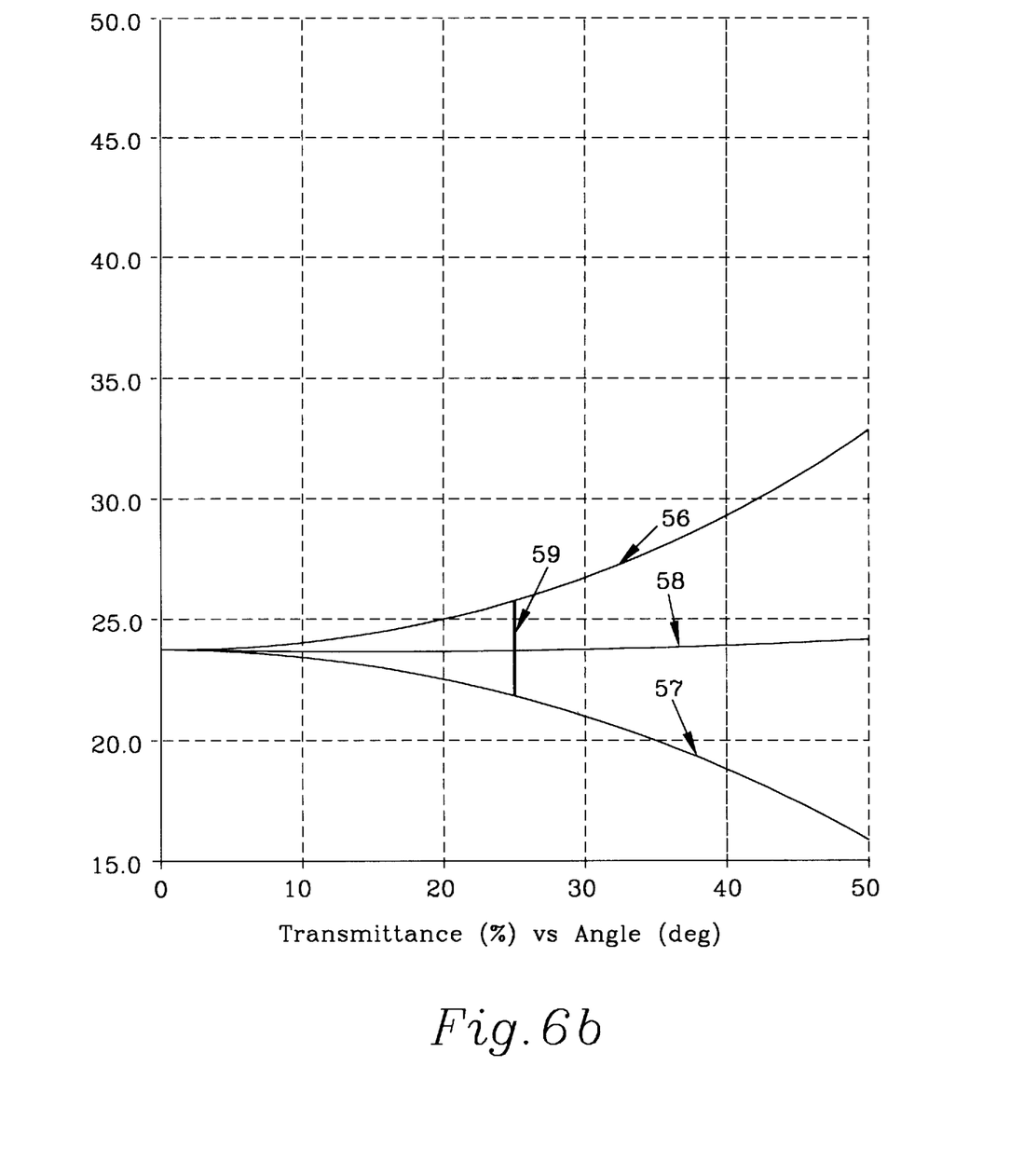

The graphs of FIGS. 6a and 6b reveal the polarization effects of a metallic reflective surface on tilted window 37. Any tilted reflector results in some polarization sensitivity;

however, an appropriate thickness and proper choice of materials of the metallic coating on window 37 minimizes the polarization effects. Reflection from a metallic surface is polarization independent until the reflecting film is thin enough to transmit light. A 95-angstrom-thick Pt (platinum) produces about 5 dB of attenuation and results in polarization curves 52, 53, and 54 of graph 6a, which show intensity reflection versus incident angle in degrees for reflection of P- and S-polarized light, and average reflected light, respectively. In graph 6b, curves 56, 57, and 58 show the polarization-dependence of P-polarized, S-polarized, and average transmitted light. Both the reflection and the transmission must be considered in determining the polarization effect on device performance. For example, at an incidence angle of 25 degrees, the differences in P- and S-polarization reflectance and transmittance are shown by lines 55 and 59. If a VCSEL shifted from emitting exclusively P-polarized light to emitting exclusively S-polarized light (an event which has been observed to occur), the reflectance would increase from 35 percent to 42 percent (a factor of 0.42/0.35=1.23), and the transmittance would decrease from 26 percent to 22 percent (a factor of 0.22/0.26=0.85). The monitor power would be increased by the 23 percent difference in reflection; the feedback loop, shown in FIG. 2, would decrease the emitted power to compensate; and the transmittance would be reduced by a further 15 percent so the power emitted outside the package would be reduced to 0.85/1.23, or 69 percent of its previous value. (This is a worst-case number since complete polarization-flipping is rare in VCSEL's.) To avoid such dramatic power fluctuations, the angle of the window must be held to the minimum consistent with other constraints of package and photo detector or diode sizes.

Figure 7:
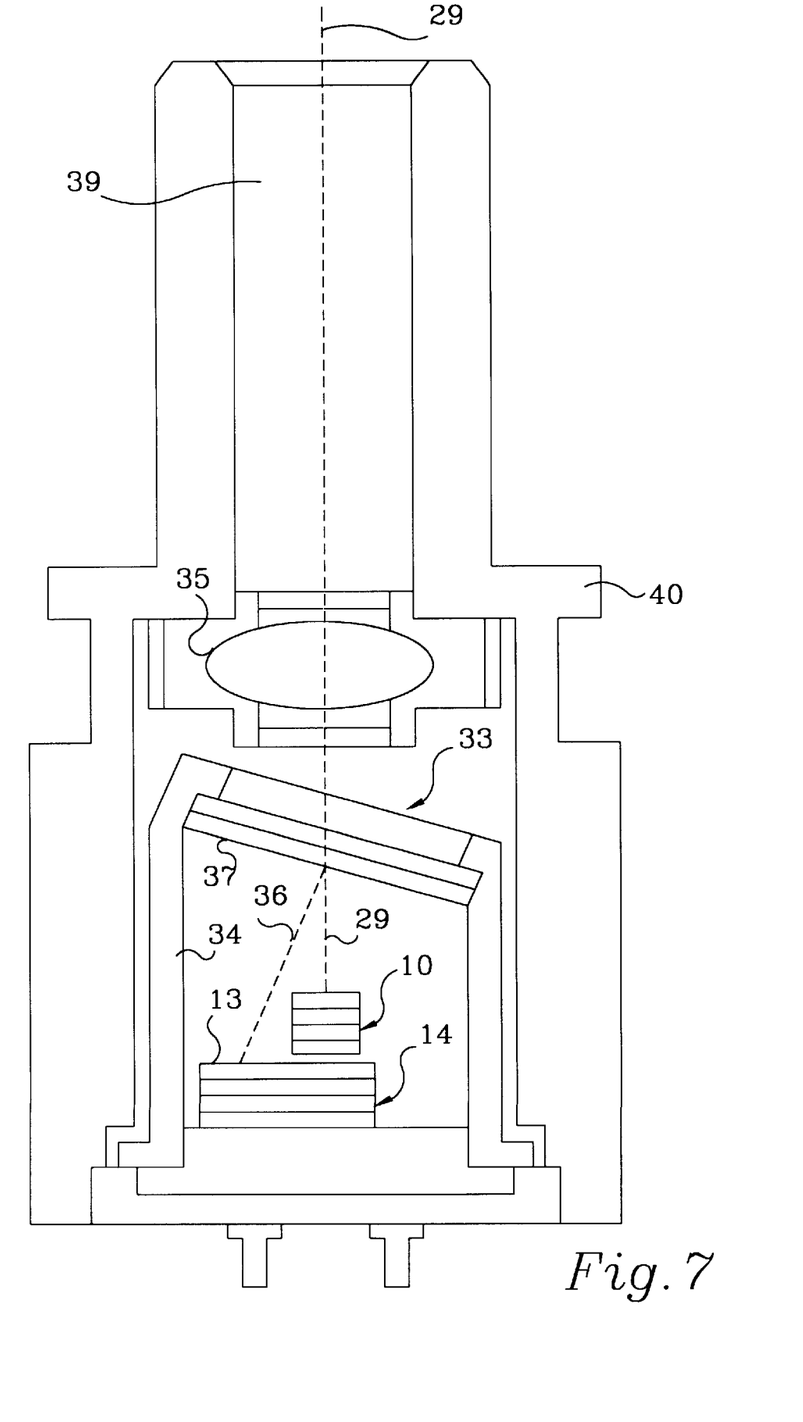
FIG. 7 shows the housing layout for the invention.

Device 33 may be inserted in a housing 40, as shown in FIG. 7, for coupling light 29 to another device via an optical fiber or other medium. The fiber, for instance, may be inserted into opening 39 of housing 40. Light 29 can be focused by lens 35 for entry into the optical fiber.

We claim:

1. A VCSEL mechanism having a feedback circuit comprising:
    a VCSEL situated on a substrate;
    a photo detector situated on the substrate;
    a window situated proximate to said VCSEL and photo detector, said VCSEL operable to emit light along a first path to said window, said window tilted at an angle $\theta$ relative to said photo detector and operable to reflect a portion of the emitted light along a second path to said photo detector;
    a variable current source having an output connected to said VCSEL; and
    a comparator having a first input connected to said photo detector, a second input connected to a reference voltage, and an output connected to an input of said variable current source;
    wherein the reflected portion of the emitted light impinges said photo detector in the form of a spot having a diameter d of a major axis of the spot.

2. The VCSEL mechanism of claim 1 wherein a tracking ratio of an output power of a non-reflected portion of the emitted light and a response signal from said feedback circuit is an approximately constant value.

3. The VCSEL mechanism of claim 2 wherein the emitted light has an emission cone having an angle $2\xi$.

4. The VCSEL mechanism of claim 3, wherein an output port of the emitted light from said VCSEL is a distance L, wherein distance L is measured parallel to the first path, from said photo detector.

5. The VCSEL mechanism of claim 4 wherein:
    a center line of said photo detector is a distance s from a center line of said VCSEL;
    a point at said window where the first path intersects, is a distance h from said photo detector, wherein distance h is measured parallel to the first path.

6. The VCSEL mechanism of claim 5 wherein the diameter d is determined by:

$$d = 2\tan(\zeta)\left(h + (h+L)\tan\left(\frac{1}{2}\tan^{-1}\left(\frac{s}{h}\right)\right)\right)\left[\frac{2-\left(\frac{s}{h}\right)^2\tan^2(\zeta)+\tan^2\left(\frac{1}{2}\tan^{-1}\left(\frac{s}{h}\right)\right)}{1-\left(\frac{s}{h}\right)^2\tan^2(\zeta)}\right].$$

7. The VCSEL mechanism of claim 6 wherein angle $$\theta = \frac{1}{2}\tan^{-1}\left(\frac{s}{h}\right).$$

8. A VCSEL having intensity control, comprising:
    a substrate;
    a diffused region formed in a first portion of said substrate;
    a dielectric having a first thickness formed on the first portion of said substrate;
    a dielectric having a second thickness formed on a second portion of said substrate;
    a pad formed on said dielectric having the second thickness
    a VCSEL formed on said pad;
    a window situated in order to convey through a first amount of light from said VCSEL and to reflect a second amount of light from said VCSEL to said diffused region; and
    a control circuit connected to said diffused region and to said VCSEL, to control a power level of light from said VCSEL.

9. The VCSEL of claim 8, wherein:
    said diffused region is a photo detector; and
    said control circuit maintains a relationship between feedback signals from said photo detector caused by the second amount of light, and the power level of the light from said VCSEL, for maintaining a constant proportional power level of the light.

10. The VCSEL of claim 9, wherein:
    said window has a coating to minimize polarization of the second amount of light; and
    said photo detector has a coating formed over it to minimize polarization sensitivity of said photo detector.

11. The VCSEL of claim 10, wherein a thickness of said dielectric having the second thickness is sufficient to minimize capacitance between said VCSEL and said photo detector.

12. The VCSEL of claim 11, wherein said window has an angle relative to said VCSEL that is adjusted to minimize polarization of the second amount of light.

13. The VCSEL of claim 12, wherein the coating formed on said photo detector is an anti-reflective coating.

14. The VCSEL of claim 13, wherein the coating formed on said window is a thin coating composed of a noble metal.

15. A VCSEL having intensity control, comprising:

a substrate;

a photo detector formed in a first portion of said substrate;

a first dielectric formed on the first portion and a second portion of said substrate;

a polarization-minimizing coating formed on the first dielectric;

a second dielectric formed over the second portion of said substrate, on said polarization-minimizing coating;

a bonding pad formed on said second dielectric;

a VCSEL formed on said pad;

a window for reflecting a portion of light from said VCSEL to said photo detector;

a control circuit connected to said photo detector and to said VCSEL for maintaining a constant proportional output of light from said VCSEL.

16. The VCSEL of claim 15 further comprising:

a polarization-minimizing coating on said window; and wherein said window has an angle that is adjusted to optimize the reflecting the portion of light from said VCSEL to said photo detector to optimize the maintaining of a constant proportional output of light from said VCSEL.

* * * * *